United States Patent
Chen (10) Patent No.: US 8,502,323 B2
(45) Date of Patent: Aug. 6, 2013

(54) RELIABLE NORMALLY-OFF III-NITRIDE ACTIVE DEVICE STRUCTURES, AND RELATED METHODS AND SYSTEMS

(75) Inventor: Jing Chen, Hong Kong (CN)

(73) Assignee: The Hong Kong University of Science and Technology, Kowloon (HK)

( * ) Notice: Subject to any disclaimer, the term of this patent is extended or adjusted under 35 U.S.C. 154(b) by 577 days.

(21) Appl. No.: 12/185,241

(22) Filed: Aug. 4, 2008

(65) Prior Publication Data

US 2009/0032820 A1    Feb. 5, 2009

Related U.S. Application Data

(60) Provisional application No. 60/953,808, filed on Aug. 3, 2007.

(51) Int. Cl.
*H01L 21/20* (2006.01)
(52) U.S. Cl.
USPC ............. 257/392; 257/E27.061; 257/E21.631
(58) Field of Classification Search
USPC ........................... 257/392, E27.061, E21.631
See application file for complete search history.

(56) References Cited

U.S. PATENT DOCUMENTS

| | | | |
|---|---|---|---|
| 3,767,984 A | 10/1973 | Sinoda et al. |
| 4,095,331 A | 6/1978 | Rutz |
| 4,157,556 A | 6/1979 | Decker et al. |
| 4,615,102 A | 10/1986 | Suzuki et al. |
| 4,710,787 A | 12/1987 | Usagawa et al. |
| 5,571,734 A | 11/1996 | Tseng et al. |
| 5,825,079 A | 10/1998 | Metzler et al. |
| 5,907,777 A | 5/1999 | Joseph et al. |
| 6,093,952 A | 7/2000 | Bandic et al. |
| 6,133,593 A | 10/2000 | Boos et al. |
| 6,166,404 A | 12/2000 | Imoto et al. |
| 6,316,793 B1 | 11/2001 | Sheppard et al. |
| 6,458,675 B1 | 10/2002 | Marukawa |
| 6,603,179 B2 | 8/2003 | Ando et al. |
| 6,825,133 B2 | 11/2004 | Yu et al. |
| 7,052,942 B1 | 5/2006 | Smart et al. |
| 7,126,426 B2 | 10/2006 | Mishra et al. |
| 7,262,446 B2 | 8/2007 | Toyama |
| 7,312,472 B2 | 12/2007 | Chiyo et al. |

(Continued)

FOREIGN PATENT DOCUMENTS

| | | |
|---|---|---|
| JP | 11121737 A | 4/1999 |
| JP | 2004-031896 | 1/2004 |

OTHER PUBLICATIONS

Office Action dated Jun. 24, 2010 for U.S. Appl. No. 11/564,795, 72 pages.

(Continued)

*Primary Examiner* — Julio J Maldonado
*Assistant Examiner* — Amar Movva
(74) *Attorney, Agent, or Firm* — Turocy & Watson, LLP (57) ABSTRACT

A field-effect transistor includes a first gate, a second gate held at a substantially fixed potential in a cascode configuration, and a semiconductor channel. The semiconductor channel has an enhancement mode portion and a depletion mode portion. The enhancement mode portion is gated to be turned on and off by the first gate, and has been modified to operate in enhancement mode. The depletion mode portion is gated by the second gate, and has been modified to operate in depletion mode and that is operative to shield the first gate from voltage stress.

8 Claims, 10 Drawing Sheets

U.S. PATENT DOCUMENTS

| | | | |
|---|---|---|---|
| 7,339,209 | B2 | 3/2008 | Brar |
| 7,375,407 | B2 | 5/2008 | Yanagihara et al. |
| 7,382,001 | B2 | 6/2008 | Beach |
| 7,402,492 | B2 | 7/2008 | Jeon et al. |
| 7,419,892 | B2 | 9/2008 | Sheppard et al. |
| 2001/0015437 | A1* | 8/2001 | Ishii et al. ............. 257/12 |
| 2003/0218183 | A1 | 11/2003 | Micovic et al. |
| 2004/0041169 | A1 | 3/2004 | Ren et al. |
| 2004/0135161 | A1 | 7/2004 | Taylor |
| 2005/0007200 | A1* | 1/2005 | Inoue et al. ............ 330/311 |
| 2005/0059197 | A1 | 3/2005 | Yamashita et al. |
| 2005/0062069 | A1* | 3/2005 | Saito et al. ............ 257/213 |
| 2005/0110054 | A1 | 5/2005 | Wohlmuth |
| 2005/0189561 | A1 | 9/2005 | Kinzer |
| 2005/0277255 | A1 | 12/2005 | Asano |
| 2006/0060871 | A1 | 3/2006 | Beach |
| 2006/0108606 | A1 | 5/2006 | Saxler et al. |
| 2006/0121658 | A1 | 6/2006 | Ahn et al. |
| 2006/0175633 | A1 | 8/2006 | Kinzer |
| 2007/0108547 | A1 | 5/2007 | Zhu et al. |
| 2007/0114569 | A1 | 5/2007 | Wu et al. |
| 2007/0224710 | A1 | 9/2007 | Palacios et al. |
| 2007/0228416 | A1 | 10/2007 | Chen et al. |
| 2007/0278518 | A1 | 12/2007 | Chen et al. |
| 2007/0295993 | A1 | 12/2007 | Chen et al. |
| 2008/0116492 | A1 | 5/2008 | Wu et al. |
| 2008/0128752 | A1 | 6/2008 | Wu |
| 2008/0191216 | A1 | 8/2008 | Machida et al. |
| 2010/0019279 | A1 | 1/2010 | Chen |

OTHER PUBLICATIONS

Office Action dated Jul. 9, 2010 for U.S. Appl. No. 11/564,766, 64 pages.
Zhang et al., "Kilovolt AlGaN/GaN HEMTs as Switching Devices," phys. stat. sol. (a) 188, No. 1, 213-217 (2001).
Zhou et al., "High breakdown voltage Schottky rectifier fabricatedon bulk n-GaN substrate," Solid-State Electronics 50 (2006) 1744-1747.
Ziegler, James, "Instruction Manual: The Stopping and Range of Ions in Matter," Dec. 22, 1995.
Final Office Action dated Dec. 24, 2009, issued in U.S. Appl. No. 11/564,780.
Non-Final Office Action dated Jan. 5, 2009, issued in U.S. Appl. No. 11/564,780.
Non-Final Office Action dated Jun. 29, 2009, issued in U.S. Appl. No. 11/564,780.
Final Office Action dated Dec. 12, 2008, issued in U.S. Appl. No. 11/564,795.
Non-Final Office Action dated Dec. 10, 2009, issued in U.S. Appl. No. 11/564,795.
Non-Final Office Action dated May 13, 2008, issued in U.S. Appl. No. 11/564,795.
Non-Final Office Action dated Jun. 10, 2009, issued in U.S. Appl. No. 11/564,795.
Okamoto et al., "Improved Power Performance for a Recessed-Gate AlGaN-GaN Heterojunction FET With a Field-Modulating Plate," IEEE Transactions on Microwave Theory and Techniques, vol. 52, No. 11, Nov. 2004, pp. 2536-2540.
Email from Dr. Cai to Dr. Chen dated Oct. 29, 2004 and attachment report.
Lab notes between Mar. 29-Oct 30, 2004 of Dr. Yong Cai, one of the inventors.
Neuberger et al., "Observation of ion-induced changes in the channel current of high electron mobility AlGaN/GaN transistors (HEMT)", 2002, Elsevier-Materials Science and Engineering, pp. 143-146.
Non-Final Office Action dated Jan. 8, 2010, issued in U.S. Appl. No. 11/564,766.
Final Office Action dated Apr. 29, 2009, issued in U.S. Appl. No. 11/564,766.
Non-Final Office Action dated Oct. 30, 2008, issued in U.S. Appl. No. 11/564,766.
Liu et al., "Highly Linear Al0:3Ga0:7N—Al0:05Ga0:95N—GaN Composite-Channel HEMTs," IEEE Electron Device Letters, vol. 26, No. 3, Mar. 2005, pp. 145-147.

Khan et al., "Insulating gate III-N heterostructure field-effect transistors for high-power microwave and switching applications," IEEE Trans. Microw. Theory Tech., vol. 51, No. 2, pp. 624-633, Feb. 2003.
Khan et al., "Enhancement and depletion mode GaN/AlGaN heterostructure field effect transistors," Appl. Phys. Lett., vol. 68, No. 4, pp. 514-516, Jan. 1996.
Khan et al., "AlGaN/GaN metal oxide semiconductor heterostructure field effect transistor," IEEE Electron Device Lett, vol. 21, No. 2, pp. 63-65, Feb. 2000.
Kim et al., "Gate current leakage and breakdown mechanism in unpassivated AlGaN/GaN high electron mobility transistors by post-gate annealing", Appl. Phys. Lett. vol. 86, 143505, Mar. 2005.
Koudymov et al., "Maximum current in nitride-based heterostructure field-effect transistors," Appl. Phys. Lett., vol. 80, No. 17, pp. 3216-3218, Apr. 2002.
Kumar et al., "AlGaN/GaN HEMTs on SiC with fT of over 120 GHz," IEEE Electron Device Lett. vol. 23, No. 8, pp. 455-457, Aug. 2002.
Kumar et al., "High transconductance enhancement-mode AlGaN/GaN HEMTs on SiC substrate," Electron. Lett., vol. 39, No. 24, pp. 1758-1760, Nov. 2003.
Lanford, et al., "Recessed-gate enhancement-mode GaN HEMT with high threshold Voltage," Electron. Lett., vol. 41, No. 7, pp. 449-450, Mar. 2005.
Lee et al., "High Breakdown Voltage GaN Schottky Barrier Diode employing Floating Metal Rings on AlGaN/GaN Hetero-junction," Proceedings of the 17 International Symposium on Power Semiconductor Devices & IC's May 23-26, 2005 Santa Barbara, CA.
Limb et al., "Low on-resistance GaN pin rectifiers grown on 6H-SiC substrates," Electronics Letters vol. 43 No. 6, Mar. 2007.
Liu et al., "AlGaN/GaN/InGaN/GaN Double Heterojunction HEMTs with an InGaN-Notch for Enhanced Carrier Confinement," IEEE Electron Device Lett. vol. 27, No. 1, pp. 10-12, Jan. 2006.
Liu et al., "DC and RF Characteristics of AlGaN/GaN/InGaN/GaN Double-Heterojunction HEMTs," IEEE Trans. Electron Devices, vol. 54, No. 1, pp. 2-10, Jan. 2007.
Mahajan et al."Fabrication and characterization of an InAlAs/InGaAs/InP ring oscillator using integrated enhancement- and depletion-mode high-electron mobility transistors," IEEE Electron Device Lett., vol. 18, No. 8, pp. 391-393, Aug. 1997.
Meneghesso et al., "Current Collapse and High-Electric-Field Reliability of Unpassivated GaN/AlGaN/GaN HEMTs," IEEE Electron Device Lett., vol. 53, No. 12, pp. 2932-2941, Dec. 2006.
Menozzi, Roberto, "Off-State Breakdown of GaAs PHEMTs: Review and New Data", IEEE Trans. Electron Devices vol. 4, No. 1, pp. 54-62, Mar. 2004.
Micovic et al., "GaN double heterojunction field effect transistor for microwave and millimeterwave power applications," in IEDM Tech. Dig. 2004, pp. 807-810.
Micovic et al., "GaN enhancement/depletion-mode FET logic for mixed signal applications," Electron. Lett., vol. 41, No. 19, pp. 1081-1083, Sep. 2005.
Mikkelson et al., "High-density GaAs integrated circuit manufacturing," IEEE Trans. Semicond. Manuf., vol. 16, No. 3, pp. 384-389, Aug. 2003.
Miller et al., "Gate leakage current mechanisms in AlGaN/GaN heterostructure field-effect transistors," J. Appl. Phys., vol. 88, No. 10, pp. 5951-5953, Nov. 2000.
Moon et al., "Submicron Enhancement-Mode AlGaN/GaN HEMTs," Jun. 2002, Digest of 60th Device Research Conference, pp. 23-44.
Nakao et al., "Study on off-state breakdown in AlGaN/GaN HEMTs," Phys. Stat. Sol. (c) vol. 0, No. 7, pp. 2335-2338, Dec. 2003.
Neudeck et al., "High-temperature electronics—A role for wide bandgap semiconductors?," Proc. IEEE, vol. 90, No. 6, pp. 1065-1076, Jun. 2002.
Nowakowski, "Choosing the Optimum Switching Frequemncy for DC-DC Converters," EE Times-India, Oct. 2006.
Ohno et al., "Effects of surface passivation on breakdown of AlGaN/GaN high-electron-mobility transistors," Appl. Phys. Lett. vol. 84, No. 12, pp. 2184-2186, Mar. 2004.
Omura et al. "Gallium Nitride Power HEMT for High Switching Frequency Power Electronics," IEEE pub. No. 978-14244-17285 (2007).

Palacios et al., "AlGaN/GaN high electron mobility transistors with InGaN back-barriers," IEEE Electron Device Lett., vol. 27, No. 1, pp. 13-15, Jan. 2006.

Palacios et al., "High-performance E-mode AlGaN/GaN HEMTs," IEEE Electron Device Lett., vol. 27, No. 6, pp. 428-430, Jun. 2006.

Cai et al., Published conference abstract of submission on Jan. 27, 2005 to the 4ih Electronics Material Conference, which was held on Jun. 22-24, 2005 in Santa Barbara, California, entitled "Threshold Voltage Control of AlGaN/GaN HEMTs by CF4 Plasma Treatment."

Rumyantsev et al., "Effect of gate leakage current on noise properties of AlGaN/GaN field effect transistors," J. Appl. Phys., vol. 88, No. 11, pp. 6726-6730, Dec. 2000.

Saito et al., "Recessed-Gate Structure Approach Toward Normally Off High-Voltage AlGaN/GaN HEMT for Power Electronics Applications," 53 IEEE Transactions of Electron Devices 356-362, Feb. 2006.

Saito et al., "High breakdown voltage AlGaN—GaN power-HEMT design and high current density switching behavior," IEEE Trans. Electron Devices, vol. 50, No. 12, pp. 2528-2531, Dec. 2003.

Sierakowski et al., "Analysis of Schottky gate electron tunneling in polarization induced AlGaN/GaN high electron mobility transistors," J. Appl. Phys., vol. 86, No. 6, pp. 3398-3401, Sep. 1999.

Song et al., "Normally Off AlGaN/GaN Low-Density Drain HEMT (LDD-HEMT) With Enhanced Breakdown Voltage and Reduced Current Collapse". IEEE Electron Device Lett., vol. 28, No. 3, pp. 189-191, 2007.

Takatani et al., "AlGaN/GaN Schottky-ohmic combined anode field effect diode with fluoride-based plasma treatment," Electronics Letters vol. 44 No. 4, Feb. 2008.

Tan et al., "Gate leakage effect and breakdown voltage in metalorganic vapor phase epitaxy AlGaN/GaN heterostructure field-effect transistors", Appl. Phys. Lett. vol. 80, No. 17, pp. 3207-3209, Apr. 2002.

Tanimoto et al., "Single-Voltage-Supply Highly Efficient E/D Dual-Gate Pseudomorphic Double-Hetero HEMT's with Platinum Buried Gates" IEEE Electron Device Lett., vol. 45, No. 6, pp. 1176-1182, Jun. 1998.

Tipirneni et al., "The 1.6-kV AlGaN/GaN HFETs" IEEE Electron Device Lett., vol. 27, pp. 716-718, 2006.

Uemoto et al., "8300V Blocking Voltage AlGaN/GaN Power HFET with Thick Poly-AlN Passivation," IEDM'07, pp. 861-864, 2007.

Uren et al., "Punchthrough in short-channel AlGaN/GaN HFETs," IEEE Trans. Electron Devices, vol. 53, No. 2, pp. 395-398, Feb. 2006.

Vetury et al., "Performance and RF Reliability of GaN-on-SiC HEMT's using Dual-Gate Architectures" pp. 714-717, 2006.

Wang et al., "Source Injection Induced Off-State Breakdown and Its Improvement by Enhanced Back Barrier with Fluorine Ion Implantation in AlGaN/GaN HEMTs," IEDM'08, pp. 149-152, 2008.

Wang et al., "Enhancement Mode $Si_3N_4$/AlGaN/GaN MISHFETs," IEEE Electron Device Letters, vol. 27, No. 10, pp. 793-795, 2006.

Wang et al., "Planar Integration of E/D-Mode AlGaN/GaN HEMTs Using Fluoride-Based Plasma Treatment," IEEE Electron Device Letters, vol. 27, No. 8, pp. 633-635, Aug. 2006.

Webb et al., "Semi-insulating C-doped GaN and high-mobility AlGaN/GaN heterostructures grown by ammonia molecular beam epitaxy," Appl. Phys. Lett. vol. 75, No. 7, pp. 953-955, Aug. 1999.

Wu et al., "High-gain Microwave GaN HEMTs with Source-terminated Field-plates" IEDM 2004, pp. 1078-1079.

Wu et al., "30-W/mm GaN HEMT by field plate optimization," IEEE Electron Device Lett. vol. 25, No. 3, pp. 117-119, Mar. 2004.

Xing et al., "High breakdown voltage AlGaN—GaN HEMTs achieved by multiple field plates," IEEE Electron Device Lett., vol. 25, No. 4, pp. 161-163, Apr. 2004.

Yoshida et al., "Low On-Voltage Operation AlGaN/GaN Schottky Barrier Diode with a Dual Schottky Structure," IEICE Trans. Electron., vol. E88-C, No. 4, pp. 690-693, Apr. 2005.

Zhang et al., "Vertical and lateral GaN rectifiers on free-standing GaN substrates," Applied Physics Letters vol. 79, No. 10, pp. 1555-1557, Sep. 2001.

Zhang et al., "Comparison of GaN P-I-N and Schottky Rectifier Performance," IEEE Transactions on Electron Devices, vol. 48, No. 3, pp. 407-501, Mar. 2001.

Office Action dated Feb. 22, 2011, for U.S. Appl. No. 12/414,865, 46 pages.

Notice of Allowance mailed Mar. 4, 2011 for U.S. Appl. No. 11/564,780, 36 pages.

Office Action dated Jul. 14, 2011 for U.S. Appl. No. 12/558,242, 53 pages.

Office Action mailed Nov. 3, 2011 for U.S. Appl. No. 12/558,242, 18 pages.

Office Action dated Sep. 14, 2012 for U.S. Appl. No. 12/558,242, 23 pages.

Ambacher et al., ""Two-dimensional electron gases induced by spontaneousand piezoelectric polarization charges in N-and Ga-face AlGaN/GaNheterostructures."" J. Appl. Phys., vol. 85, No. 6, pp. 3222-3233, Mar. 1999.

Ando et al., "10-W/mm AlGaN—GaN HFET With a Field Modulating Plate," IEEE Electron Device Letters, vol. 24, No. 5, 289-291, May 2003.

Ando et al., "Novel AlGaN/GaN Dual-Field-Plate FET With High Gain, Increased Linearity and Stability," IEDM 2005, pp. 576-579, 2005.

Anwar et al. "Carrier trapping and current collapse mechanism in GaN metal-semiconductor field-effect transistors," Appl. Phys. Lett. vol. 84, No. 11, pp. 1970-1972, Mar. 2004.

Ao et al., "Copper gate AlGaN/GaN HEMT with low gate leakage current," IEEE Electron Device Lett., vol. 24, No. 8, pp. 500-502, Aug. 2003.

Arulkumaran et al., "Surface passivation effects on GaN high-electron-mobility transistors with $SiO_2$, $Si_3N_4$, and silicon oxynitride," J. Appl. Phys., vol. 84, No. 4, pp. 613-615, Jan. 2004.

Bahat-Treidel et al., "Punchthrough-Voltage Enhancement of AlGaN/GaN HEMTs Using AlGaN Double-Heterojunction Confinement", IEEE Trans. Electron Devices vol. 55, No. 12, pp. 3354-3359, Dec. 2008.

Bahl et al., "A New Drain-Current Injection Technique for the Measurement of Off-State Breakdown Voltage in FET's," IEEE Trans. Electron Devices, vol. 40, No. 8, pp. 1558-1560, Aug. 1993.

Bandic et al., "High voltage (450 V) GaN Schottky rectifiers," Applied Physics Letters vol. 74, No. 9, pp. 1266-1268, Mar. 1999.

Ben-Yaacov et al., "AlGaN/GaN current aperture vertical electron transistors with regrown channels,"J. Appl. Phys., vol. 95, No. 4, pp. 2073-2078, Feb. 2004.

Bern et al., "Effect of surface passivation on performance of AlGaN/GaN/Si HEMTs," Solid State Electron., vol. 47, No. 11, pp. 2097-2103, Nov. 2003.

Boguslawski et al., "Native Defects in Gallium Nitride". Phys. Rev. B, vol. 51, No. 23, pp. 17255-17259, Jun. 1995.

Cai et al., "Control of Threshold Voltage of AlGaN/GaN HEMTs by Fluoride-Based Plasma Treatment: From Depletion to Enhancement Mode," IEEE Electron Device Letters, vol. 53, No. 9, pp. 2207-2215, 2006.

Cai et al., "III-nitride metal-insulator-semiconductor heterojunction field-effect transistor," Appl. Phys. Lett., vol. 86, No. 3, p. 032109, Jan. 2005.

Cai et al., "High-Performance Enhancement-Mode AlGaN/GaN HEMTs Using Fluoride-Based Plasma Treatment," IEEE Electron Device Lett. vol. 26, No. 7, pp. 435-437, Jul. 2005.

Cai et al., "Monolithically Integrated Enhancement/Depletion-Mode AlGaN/GaN HEMT Inverters and Ring Oscillators Using CF4 Plasma Treatment," IEEE Trans. Electron Devices, vol. 53, No. 9, pp. 2223-2230, Sep. 2006.

Cai et al., "Monolithic integration of enhancement- and depletion-mode AlGaN/GaN HEMTs for GaN digital integrated circuits," in IEDM Tech. Dig., Dec. 2005, pp. 771-774.

Cai et al., "High-Temperature Operation of AlGaN/GaN HEMTs Direct-Coupled FET Logic (DCFL) Integrated Circuits," IEEE Electron Device Lett. vol. 28, No. 5, pp. 328-331, May 2007.

Chen et al., "High-Performance InP-based Enhancement-Mode HEMTs Using Non-Alloyed Ohmic Contacts and Pt-based Buried-Gate Technologies," Feb. 1996, IEEE Trans. on Electron Devices, vol. 43, No. 2, pp. 252-257.

Chen et al., "AlGaN/GaN dual-gate modulation-doped field-effect transistors" IEEE Electronics Letters vol. 35, No. 11, pp. 933-934, May 1999.

Chen et al., "Dual-Gate AlGaN/GaN Modulation-Doped Field-Effect Transistors with Cut-Off Frequencies fT > 60 GHz," IEEE Electron Device Lett., vol. 21, No. 12, pp. 549-551, Dec. 2000.

Chini et al., "Power and linearity characteristics of GaN MISFET on sapphire substrate," IEEE Electron Device Lett., vol. 25, No. 2, pp. 55-57, Feb. 2004.

Chow et al., "Wide band gap compound semiconductors for superior high-voltage unipolar power devices," IEEE Trans. Electron Devices, vol. 41, No. 8, pp. 1481-1483, Aug. 1994.

Chu, "Recent developments and applications of plasma immersion ion implantation," J. Vac. Sci. Technol. B, vol. 22, No. 1, pp. 289-296, Jan./Feb. 2004.

Dang et al., "Fabrication and characterization of enhanced barrier AlGaN/GaN HFET", Electron. Lett. vol. 35, No. 7, pp. 602-603, 1999.

Daumiller et al., "Evaluation of the temperature stability of AlGaN/GaN heterostructure FET's," IEEE Electron Device Lett., vol. 20, No. 9, pp. 448-450, Sep. 1999.

Di Forte-Poisson et al., "Relationship between physical properties and gas purification in GaN grown by metalorganic vapor phase epitaxy," J. Cryst. Growth, vol. 195, No. 1-4 pp. 314-318, Dec. 1998.

Dora et al., "High breakdown voltage achieved on AlGaN/GaN HEMTs with integrated slant field plates," IEEE Electron Device Lett., vol. 27, No. 9, pp. 713-715, Sep. 2006.

Cai et al. "Self-aligned Enhancement Mode AlGan/GaN HEMTs Using Fluoride-based Plasma Treatment" 2005 IEEE, pp. 179-180.

Dyakonova et al., "Temperature dependence of impact ionization in AlGaN—GaN heterostructures field effect transistors," Appl. Phys. Lett. vol. 72, No. 20, pp. 2562-2564, May 1998.

Eden et al., "Planar GaAs IC Technology: Applications for digital LSI," IEEE J. Solid-State Circuits, vol. 13, No. 4, pp. 419-426, Aug. 1978.

Egawa et al., "Characterizations of recessed gate AlGaN/GaN HEMTs on sapphire," IEEE Trans. Electron Devices, vol. 48, No. 3, pp. 603-608, Mar. 2003.

Endoh et al., "Non-recessed-gate enhancement-mode AlGaN/GaN high electron mobility transistors with high RF performance," Jpn. J. Appl. Phys., vol. 43, No. 4B, pp. 2255-2258, 2004.

Hashizume et al., "Leakage mechanism in GaN and AlGaN Schottky interfaces," Appl. Phys. Lett., vol. 84, No. 24, pp. 4884-4886, Jun. 2004.

Hashizume et al., "Suppression of current collapse in insulated gate AlGaN/GaN heterostructure field-effect transistors using ultrathin $Al_2O_3$ dielectric," Appl. Phys. Lett., vol. 83, No. 14, pp. 2952-2954, Oct. 2003.

Heikman et al., "Growth of Fe doped semi-insulating GaN by metalorganic chemical vapor deposition," Appl. Phys. Lett. vol. 81, No. 3, pp. 439-441, Jul. 2002.

Horio et al., "Physics-based simulation of buffer-trapping effects on slow current transients and current collabpse in GaN field effect transistors," J. Appl. Phys., vol. 98, pp. 124502-1-124502-7, Dec. 2005.

Hu et al., "$Si_3N_4$/AlGaN/GaN-metal-insulator-semiconductor heterostructure field-effect transistors," Appl. Phys. Lett., vol. 79, No. 17, pp. 2832-2834, Oct. 2001.

Hu et al., "Enhancement mode AlGaN/GaN HFET with selectively grown pn junction gate," Electron. Lett., vol. 36, No. 8, pp. 753-754, 2000.

Hussain, et al., "GaN HFET digital circuit technology for harsh environments," Electron. Lett., vol. 39, No. 24, pp. 1708-1709. Nov. 2003.

Irokawa et al., "Current-voltage and reverse recovery characteristics of bulk GaN p-i-n. rectifiers," Applied Physics Letters, vol. 83, No. 11, pp. 2271-2273, Sep. 2003.

Jia et al., "Enhancement-mode AlGaN/GaN HEMTs on silicon substrate" phys. stat. sol. (c) 3, No. 6, 2368-2372 (2006).

Joh et al., "Mechanisms for Electrical Degradation of GaN High-Electron Mobility Transistors," Electron Devices Meeting, 2006. IEDM '06. International Volume, Dec. 11-13, 2006.

Johnson et al., "Breakdown Voltage and Reverse Recovery Characteristics of Free-Standing GaN Schottky Rectifiers," IEEE Transactions on Electron Devices, vol. 49, No. 1, pp. 32-36, Jan. 2002.

Johnson et al., "12 W/mm AlGaN/GaN HFETs on siicon substrates," IEEE Electron Device Lett., vol. 25, No. 7, pp. 459-461, Jul. 2004.

Kanamura et al., "An over 100 W n-GaN/n-AlGaN/GaN MIS-HEMT power amplifier for wireless base station applications," in IEDM Tech. Dig., Dec. 2005, pp. 572-575.

Kanechika et al., "A vertical insulated gate AlGaN/GaN heterojunction field-effect transistor," Jpn. J. Appl. Phys., vol. 46, No. 21, pp. L503-L505, May 2007.

Karmalkar et al., "Enhancement of Breakdown Voltage in AlGaN/GaN High Electron Mobility Transistors Using a Field Plate," IEEE Trans. Electron Devices, vol. 48, No. 8, pp. 1515-1521, Aug. 2001.

Karmalkar et al., "Mechanism of the reverse gate leakage in AlGaN/GaN high electron mobility transistors," Appl. Phys. Lett., vol. 82, No. 22, pp. 3976-3978, Jun. 2000.

Ketterson et al., "GaAs/AlGaAs and InGaAs/AlGaAs MODFET inverter simulations," IEEE Trans. Electron Devices, vol. ED-33, No. 11, pp. 1626-1634, 1986.

* cited by examiner

DC characteristics ($V_{th}$, $I_{max}$, $G_m$ and $R_{on}$) as a function of thermal stress time. Stress temperature is 350 °C. The measurement is conducted at room temperature after the sample is cooled down at various time of the entire stress process.

RELIABLE NORMALLY-OFF III-NITRIDE ACTIVE DEVICE STRUCTURES, AND RELATED METHODS AND SYSTEMS

CROSS-REFERENCE TO OTHER APPLICATION

Priority is claimed from U.S. Provisional Application Ser. No. 60/953,808 filed Aug. 3, 2007, which is hereby incorporated by reference.

BACKGROUND

The present invention relates to electronics, more particularly to semiconductor devices and related methods, and most particularly to III-N type devices in which both enhancement- and depletion-mode devices are made available by patterned dopant ions.

Many field effect transistors (FETs) operate in an ON state at zero applied gate voltage; such transistors are called "depletion-mode." "Enhancement-mode" FETs are those which are in an OFF state at zero applied gate voltage.

An important area of research in semiconductor devices has been the search for a semiconductor technology using a material with a wider bandgap than silicon. Wider bandgap materials have the potential to operate at higher temperatures and higher breakdown voltages. Many years of research and development have been invested in III-V compound semiconductors, such as GaAs and related compounds (InP, AlGaAs, etc.).

In recent years the family of "III-N" semiconductors has been an area of intense development. GaN provided the first blue LED, and such LEDs are now in commercial use. Development of transistors or other active devices in this materials system is very attractive, because of the high bandgaps available (e.g. 3.4V for GaN, and higher for AlGaN alloys).

A difficulty in achieving III-N active devices was the lack of enhancement-mode devices. A key breakthrough in this area was achieved by the present inventor and colleagues, using fluorine implantation to introduce fixed charge into the top (higher-bandgap) layer of a HEMT-like device. These techniques are described in published U.S. patent applications 2007-0295993, 2007-0228416, and 2007-0278518, all of which are hereby incorporated by reference in their respective entireties for all purposes.

Note that the points discussed above may reflect the hindsight gained from the disclosed inventions, and are not necessarily admitted to be prior art.

SUMMARY

The present inventor has realized that threshold voltage drift can occur, in devices of the types described above, under voltage stress. The present application teaches that such voltage drift can be prevented, in various embodiments, by using dual-gate enhancement/depletion devices, especially if the gates are connected in a cascode configuration. This provides a more reliable and stable device, at the cost of only minimal degradation in the device's drive capability.

BRIEF DESCRIPTION OF THE DRAWINGS

The following figures form part of the present specification and are included to further demonstrate certain aspects of the present claimed subject matter, and should not be used to limit or define the present claimed subject matter. Consequently, a more complete understanding of the present embodiments and further features and advantages thereof may be acquired by referring to the following description taken in conjunction with the accompanying drawings, in which the leftmost significant digit(s) in the reference numerals denote(s) the first figure in which the respective reference numerals appear, wherein:

DETAILED DESCRIPTION OF THE DRAWINGS

Figure 1:
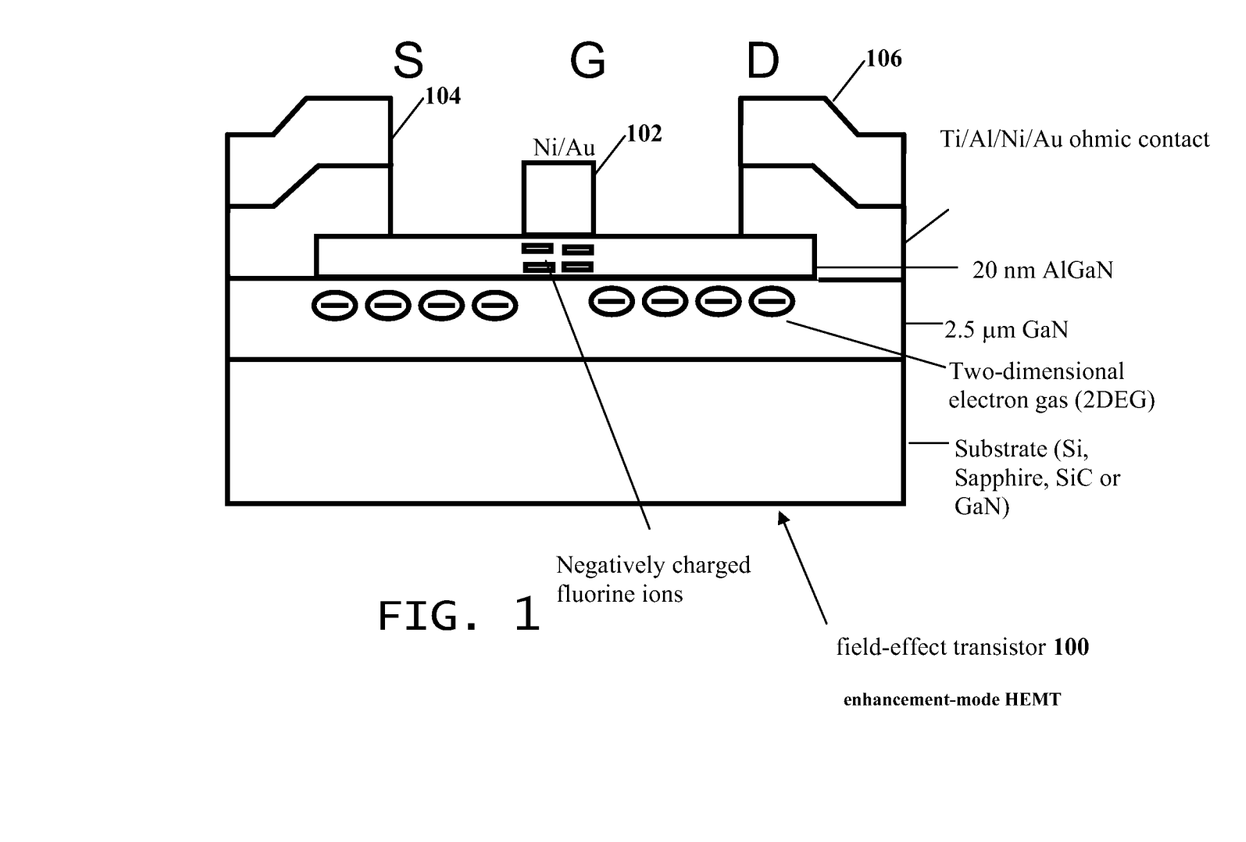
FIG. 1 is a cross sectional schematic diagram of a field-effect transistor 100 including at least one teaching of the present invention.

FIG. 1 is a cross sectional schematic diagram of a field-effect transistor 100 including at least one teaching of the present invention. The field-effect transistor 100 includes a HEMT (High Electron Mobility Transistor), which uses a heterostructure, i.e. a junction between two materials with different bandgaps, instead of local doping to provide mobile electrons in a channel. The heterostructure includes a highly doped wide-bandgap n-type donor-supply layer whose electrons drop completely into an undoped narrow-bandgap channel layer with no dopant impurities. The undoped narrow-bandgap channel layer then accommodates a two-dimensional electron gas, i.e. a very thin layer of highly mobile conducting electrons with very high concentration. The electrons can move quickly without colliding with any impurities because the undoped narrow-bandgap channel layer is undoped. The heterojunction created by different band-gap materials forms a steep canyon in the conduction band on the undoped narrow-bandgap channel layer side from which they cannot escape. A buffer layer may be included.

Negatively charged fluorine ions are incorporated into the top AlGaN barrier, which effectively depletes the electrons in the channel. For practical implementation of the fluorine plasma treatment technology in the fabrication of normally-off III-V FETs, it is important to ensure the stability of the fluorine ions, making sure that they do not move around after long-term electrical stress. The field-effect transistor 100 has a threshold voltage that remains stable during the device operation, especially under high electric-field electrical stress or high temperature thermal stress, provided the fluorine ions do not migrate due to intense electrical-field and/or thermal stress. Enhancement mode (or normally off) transistors, whose channel current is zero when a gate voltage is zero, are often more appropriate for FETs in a power electronics or logic circuit. Normally-on (depletion mode) devices remain ON at zero gate bias and become OFF at negative gate bias The heterojunction, or two-dimensional electron gas (2DEG) is a thin layer where the Fermi energy is above the conduction band, giving the channel low resistance or high electron mobility. Of course, other compounds may be used. GaN, AlN, AlInN, AlGaN, InGaN, InAlGaN or combinations thereof, each possibly doped e.g. with Silicon, each consisting of one or more layers; regions may be possibly separated by a spacer.

For example, a gate 102 has a length of 1 μm, and is spaced from a source 104 by a distance of 1 μm (gate-source spacing) and from a drain 106 by a distance of 3 μm (gate-drain spacing). The devices need not be passivated. Initial values of Vth, Imax, Gm, Ron, may be +1.02 V, 240 mA/mm, 135 mS/mm, and 11.9 ohm-mm, respectively. The off-state breakdown voltage (VBK) is about 60 V before the stress test. The field-effect transistor 100 has an ON state and an OFF state. When the device is being used, VDS may be, for example, 15V, 30 V, or 45 V, or other value. A gate-source voltage VGS may be fixed at −2 V (below pinch-off) in the OFF-state and 2 V (corresponding to a 150 mA/mm drain current density) in the ON-state. High quality III-V device substrates and active device and buffer layers may be grown epitaxially, using molecular beam epitaxy (MBE), metalorganic chemical vapor deposition (MOCVD), vapor phase epitaxy, and variations thereof.

Figure 2:
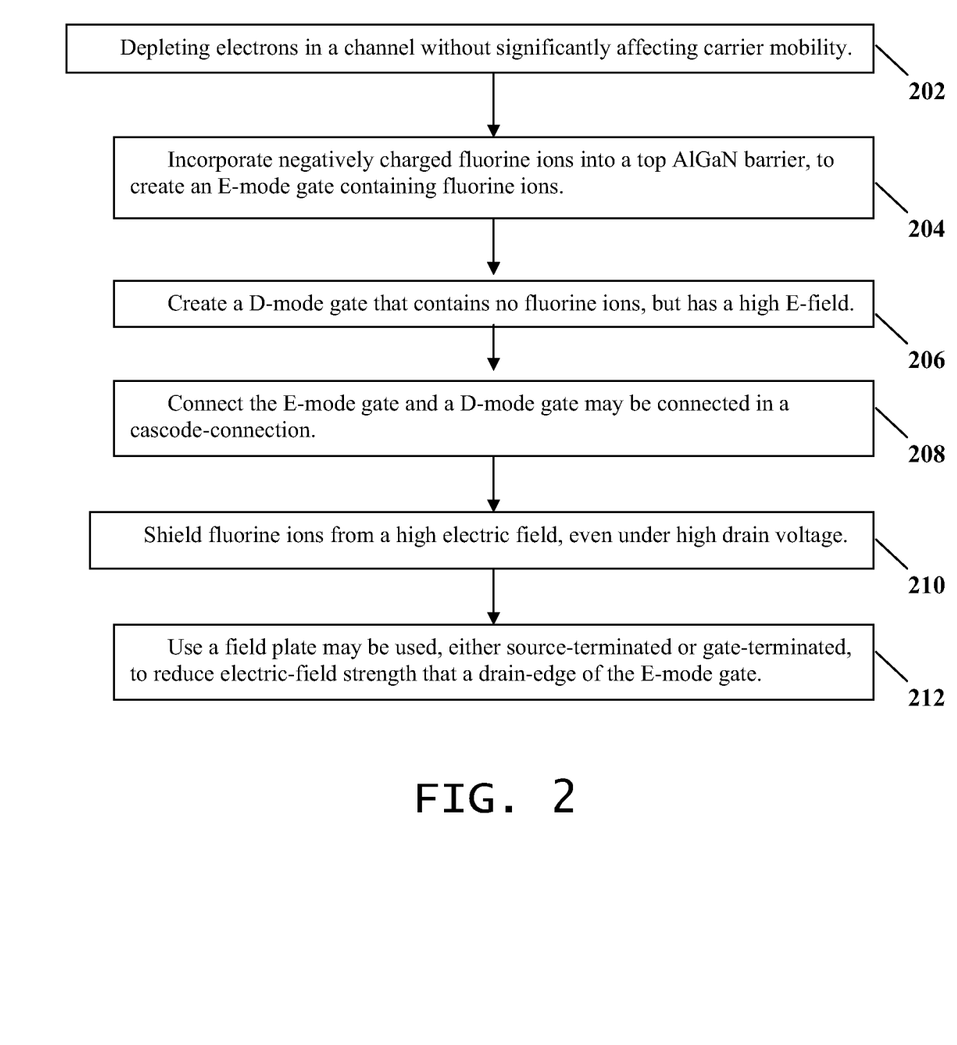
FIG. 2 is a flowchart of a method of manufacturing a field-effect transistor, and includes at least one teaching of the present invention.

FIG. 2 is a flowchart of a method of manufacturing a field-effect transistor, and includes at least one teaching of the present invention. The method of FIG. 2 includes converting a channel of an as-grown depletion-mode (D-mode) III-nitride HEMT structure into E-mode. Specifically, the method comprises depleting 202 electrons in a channel without significantly affecting carrier mobility. For example, negatively charged fluorine ions may be incorporated 204 into a top AlGaN barrier, to create an E-mode gate containing fluorine ions. A D-mode gate may also be created 206 that contains no fluorine ions, but has a high E-field.

The E-mode gate and a D-mode gate may be connected 208 in a cascode-connection. Fluorine ions may be shielded 210 from a high electric field, even under high drain voltage. If desired, a field plate may be used 212, either source-terminated or gate-terminated, to reduce electric-field strength at a drain-edge of the E-mode gate.

Figure 3:
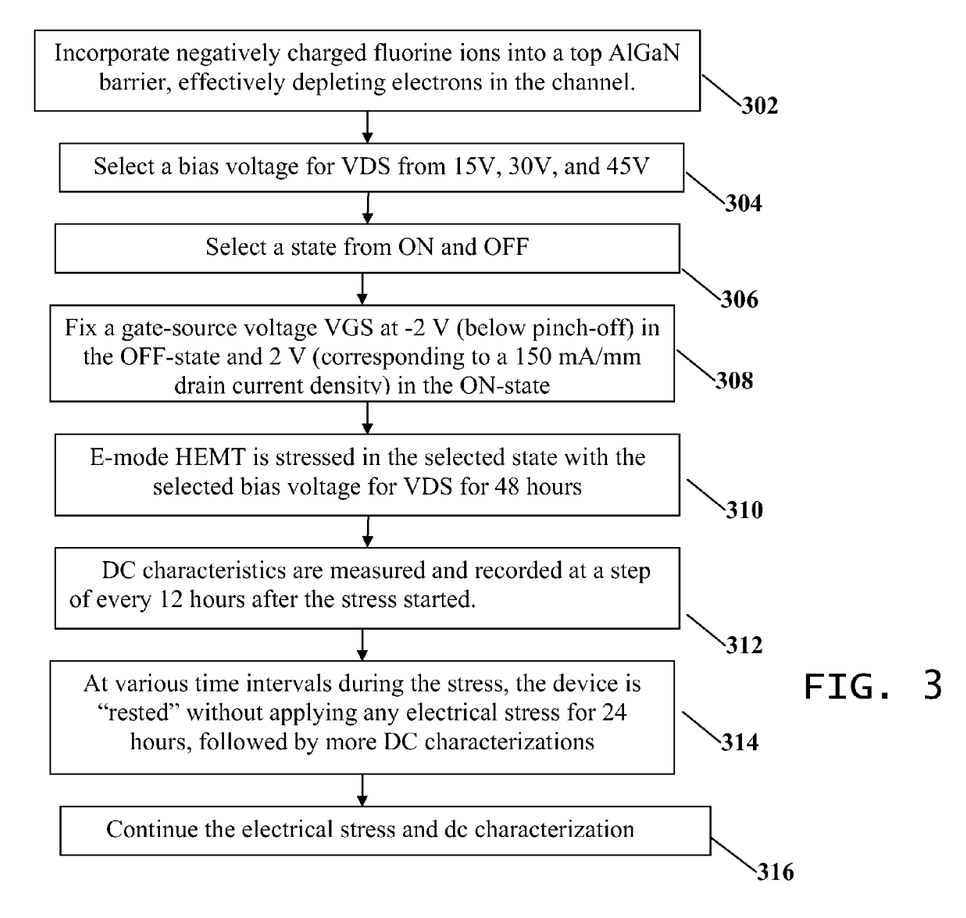
FIG. 3 is a flowchart of a method for using a field-effect transistor, e.g. E-mode AlGaN/GaN HEMT fabricated by a fluorine plasma treatment, and includes at least one teaching of the present invention.

FIG. 3 is a flowchart of a method for using a field-effect transistor, e.g. an E-mode AlGaN/GaN HEMT fabricated by a fluorine plasma treatment, and includes at least one teaching of the present invention. The method depicted with respect to FIG. 3 tests reliability of enhancement-mode AlGaN/GaN HEMTs (fabricated by a fluorine plasma treatment technique) by applying OFF-state and ON-state long-term high-electric-field stress, with focus on Vth's stability under high electric-field stress.

A moderate negative shift (−0.25 V) is observed in the threshold voltage after 288 hours of stress. This shift, however, can be eliminated with an enhancement/depletion dual-gate configuration, which effectively prevents high electric field from influencing the fluorine plasma treated area.

Enhancement-mode (or normally-off) III-nitride HEMTs, with a positive threshold voltage (Vth), are key components for high-speed power switches, high temperature GaN integrated circuits, and RFICs and MMICs with single voltage supply. They provide the benefits of simple circuit configuration as well as favorable operating conditions for device safety. A robust and low-cost technique, namely, the fluoride-based plasma treatment, [2] has been developed for converting the channel of as-grown depletion-mode (D-mode) III-nitride HEMT structures into E-mode.

The E-mode HEMTs are fabricated using the fluorine plasma treatment technique, and feature a 1 μm gate length, a 1 μm gate-source spacing and a 3 μm gate-drain spacing. The devices are not passivated for simplicity in analysis. Initial values of Vth, Imax, Gm, Ron, are +1.02 V, 240 mA/mm, 135 mS/mm, and 11.9 mm. The off-state breakdown voltage (VBK) is about 60 V before the stress test. Negatively charged fluorine ions are incorporated 302 into a top AlGaN barrier, which effectively depletes the electrons in the channel. Stability and reliability of the fluorine ions and the threshold voltage's stability during the device operation are addressed, for practical implementation of the fluorine plasma treatment under high electric-field electrical stress or high temperature thermal stress.

A set of testing conditions, including a bias voltage for VDS, a gate-source voltage VGS, and a time interval, is selected. Specifically, a bias voltage for VDS is selected 304 from 15V, 30V, and 45V, and a state is selected 306 from ON and OFF. The gate-source voltage VGS is fixed 308 at −2 V (below pinch-off) in the OFF-state and 2 V (corresponding to a 150 mA/mm drain current density) in the ON-state. The E-mode HEMT is stressed in the selected state with the selected bias voltage for VDS for 48 hours 310. DC characteristics are measured 312 and recorded at a step of every 12 hours after the stress started. At chosen time intervals, 144 hours, 196 hours and 288 hours, the device is "rested" for 24 hours 314 with no electrical stress applied, followed by DC characteristics. If all sets of testing conditions have not yet been executed, another set of testing conditions is selected 316.

Figure 4A:
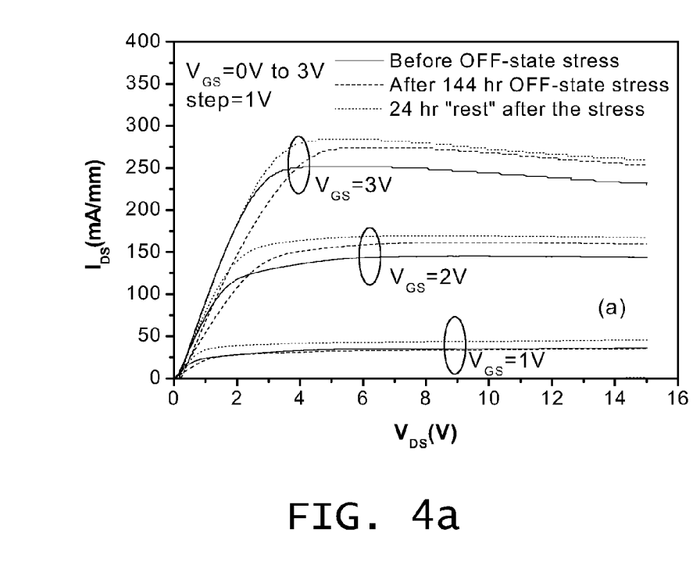
FIGS. 4a and 4b are graphs of source-drain output characteristics and transfer characteristics, respectively, of the E-mode HEMT before and after 144-hours OFF-state stress, in accordance with the method of FIG. 3.
Figure 4B:
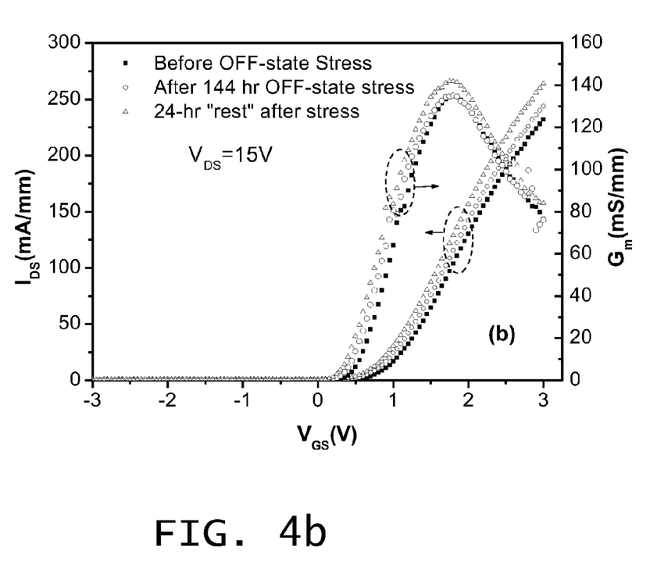

FIGS. 4a and 4b are graphs of source-drain output characteristics and transfer characteristics, respectively, of the E-mode HEMT before and after 144-hours OFF-state stress, in accordance with the method of FIG. 3. The characteristics after the stress include the ones measured right after the stress and with a 24-hour of no-stress rest.

Figure 5A:
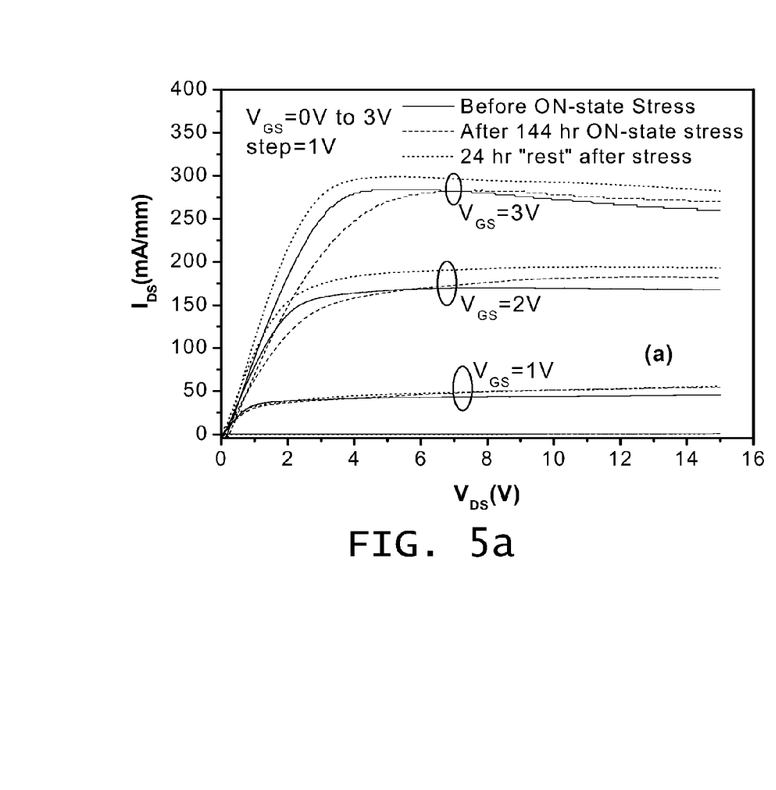
FIGS. 5a and 5b are graphs of source-drain output characteristics and transfer characteristics, respectively, of the E-mode HEMT before and after an additional 148-hours ON-state stress, in accordance with the method of FIG. 3.
Figure 5B:
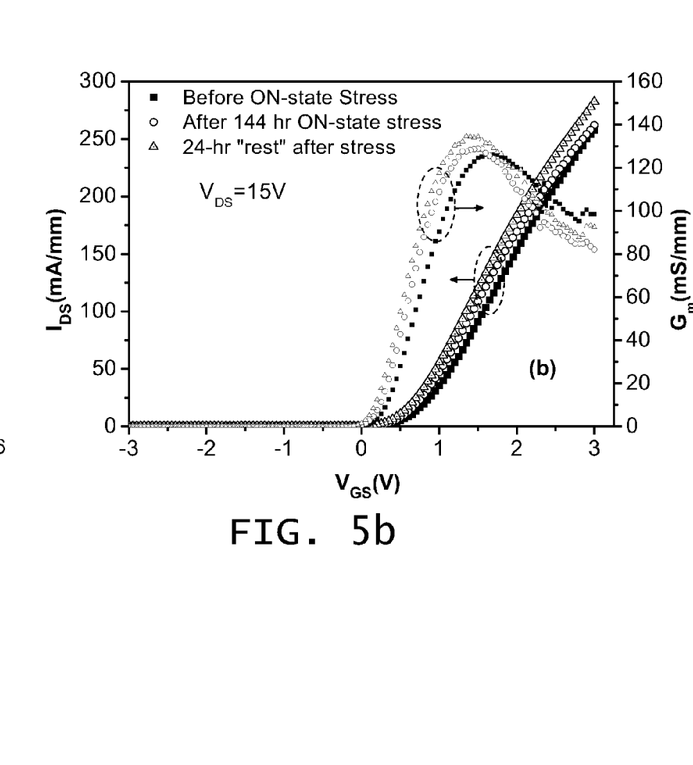

FIGS. 5a and 5b are graphs of source-drain output characteristics and transfer characteristics, respectively, of the E-mode HEMT before and after an additional 148-hours ON-state stress, in accordance with the method of FIG. 3. The characteristics after the stress include the ones measured right after the stress and with a 24-hour of no-stress rest.

Figure 6A:
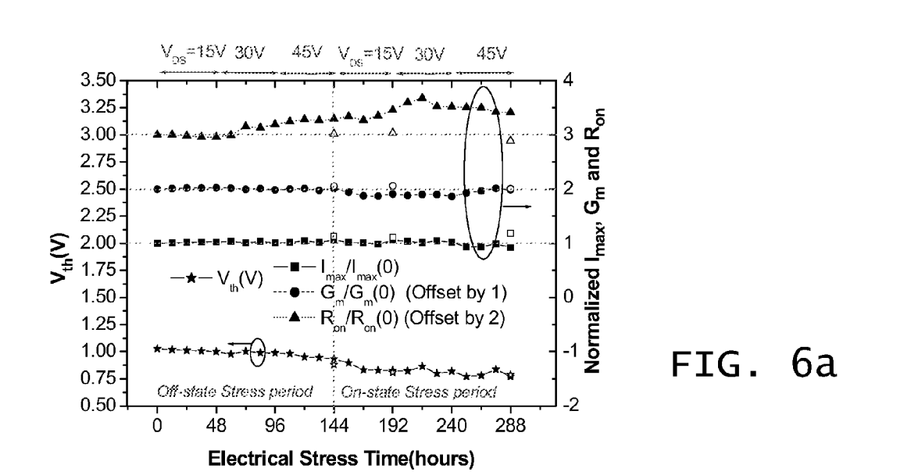
FIG. 6a is a graph of DC characteristics (Vth, Imax Gm and Ron) as a function of high electric-field stress time, in accordance with the method of FIG. 3.
Figure 6B:
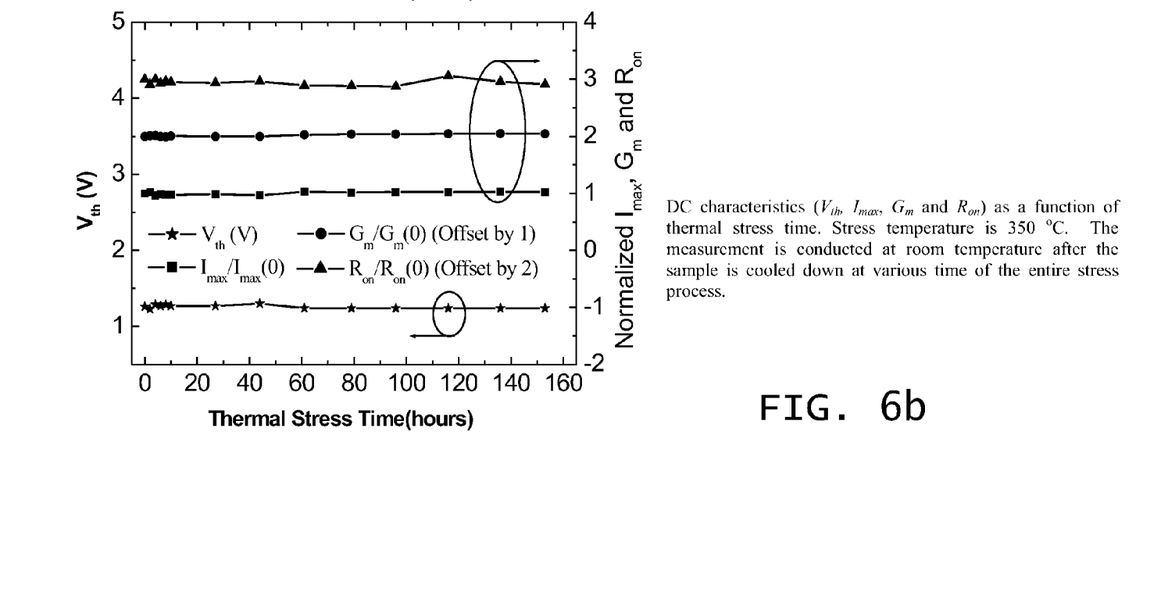
FIG. 6b is a graph of DC characteristics (Vth, Imax, Gm and Ron) as a function of thermal stress time.

FIG. 6a is a graph of DC characteristics (Vth, Imax Gm and Ron) as a function of high electric-field stress time, in accordance with the method of FIG. 3. Solid symbols are results measured right after the stress. Hollow symbols are the data measured after a 24 hours of no-stress rest. FIG. 6b is a graph of DC characteristics (Vth, Imax, Gm and Ron) as a function of thermal stress time. Stress temperature is 350° C. The measurement is conducted at room temperature after the sample is cooled down at various time of the entire stress process.

With respect to FIGS. 4a, 4b, 5a, 5b, 6a and 6b, it is observed that Vth experienced a gradual but persistent high-field-induced negative shift (from 1.02 V to 0.77 V) after 144 hours of OFF-state plus 144 hours of ON-state high-field stress. This negative shift in Vth cannot be recovered by no-stress rest, while the degradation in the on-resistance (Ron) can "recover" after the rest. It is also found that Vth, Ron, maximum drain current density Imax, and peak transconductance Gm are stable during 153 hours of thermal stress at 350° C., suggesting excellent thermal stability for the fluorine ions incorporated in III-nitride materials.

Figure 7A:
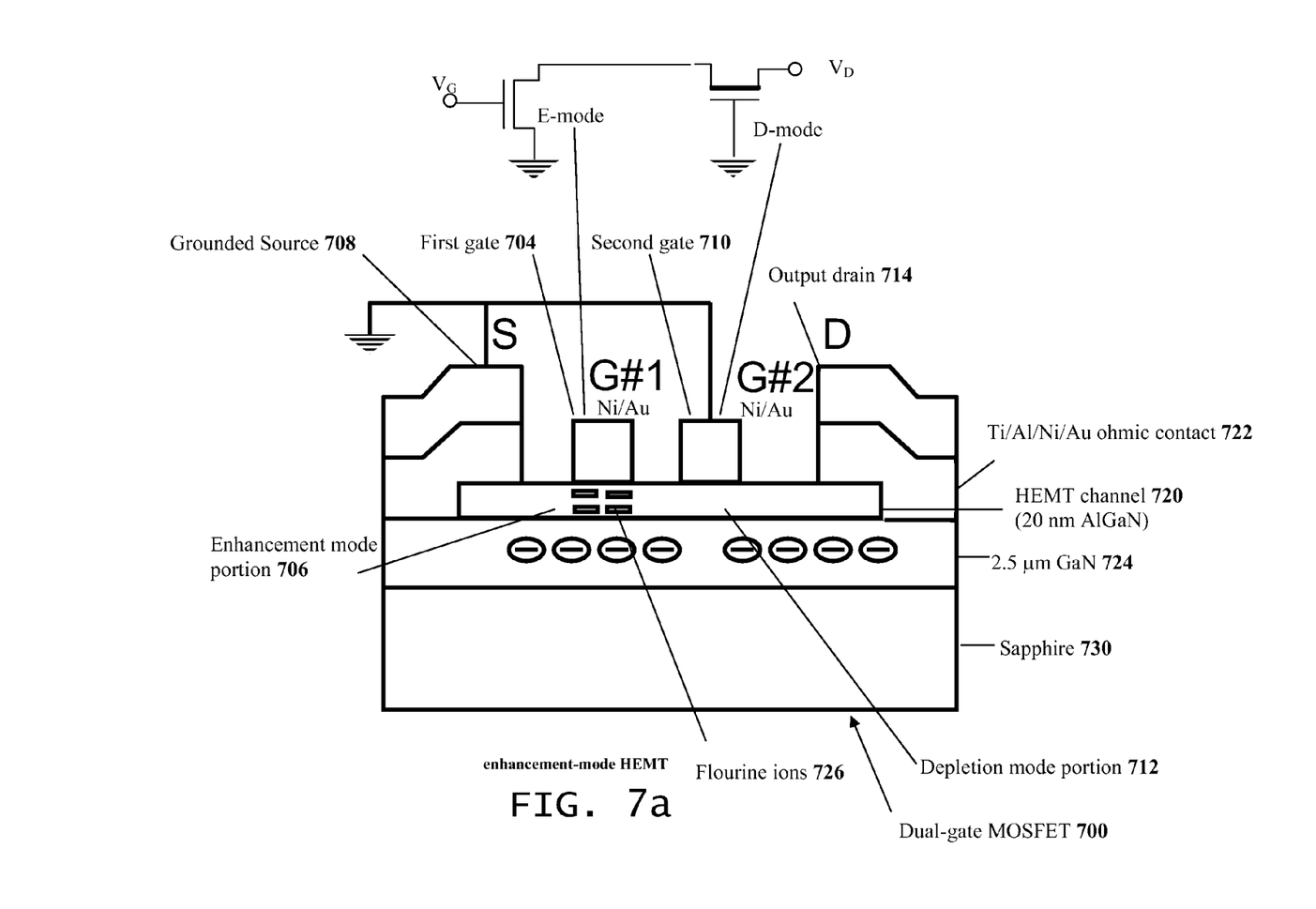
FIG. 7a is a cross sectional schematic diagram of a dual-gate MOSFET (metal oxide semiconductor field-effect transistor) 700 including at least one teaching of the present invention.

FIG. 7 is a cross sectional schematic diagram of a dual-gate MOSFET (metal oxide semiconductor field-effect transistor) 700 including at least one teaching of the present invention. The dual-gate ("DG") HEMT is based on a cascode-connection of an E-mode gate and a D-mode gate, and leads to improved stability and reliability by physically separating the E-mode gate from the high electric field. The dual-gate MOSFET 700 is arranged in a cascode arrangement, with a common source FET (i.e., a FET having a grounded source terminal 708) driven by a signal source Vin, and a common gate FET (i.e., a FET having a grounded gate terminal) providing an output signal Vout. The common source FET has a drain, and the common gate FET has a source, that are coupled together within a HEMT channel 720, designated as a two-dimensional electron gas. The dual-gate MOSFET 700 also includes a Ti/Al/Ni/Au ohmic contact 722, 2.5 µm GaN 724, Fluorine ions 726, and Sapphire 730. Since the shift in Vth is due to the presence of high electric-field in the gate region of the E-mode HEMT, physical separation of the E-mode gate and high electric-field could lead to improved stability and reliability. To improve Vth's stability, a dual-gate (DG) HEMT based on a cascode-connection of an E-mode gate and a D-mode gate is designed and fabricated as shown.

In the dual-gate MOSFET 700 of FIG. 7, however, the common source FET is operated in enhancement mode. The common source FET includes a first gate 704 which is driven by the signal source Vin, an enhancement mode portion 706 within the HEMT channel, which is gated to be turned on and off by the first gate, and the grounded source terminal 708. The first gate 704, or first gate terminal, is fabricated of a material such as nickel, gold, nickel/gold alloy, or other conductive material. The enhancement mode FET includes an enhancement mode portion and a depletion mode portion.

The enhancement mode portion 706 has an insertion element that can deplete the semiconductor channel near the first gate. The insertion element can include, for example, fluorine ions 726; enhancement mode can be achieved by implantation of fluorine ions 726. The depletion mode portion 706 of the semiconductor channel 720 at least partially shields the insertion element, such that the insertion element does not significantly migrate from the enhancement mode portion in response to an electrical-field and/or thermal stress at the depletion mode portion.

The common gate FET, i.e. depletion mode FET, has a second gate 710, or second gate terminal, that is fabricated of a material such as nickel, gold, nickel/gold alloy, or other conductive material and that that is held at a substantially fixed potential, such as ground potential (as a common gate). For example, the second gate 710 may be electrically coupled to the source terminal of the field effect transistor.

The second gate 710 is electrically coupled to a fixed potential, such as a ground potential. The second gate 710 may comprise a field plate. If desired, the second gate 710 may be electrically coupled to the first gate 704.

The depletion mode FET also has a depletion mode portion 712, gated by the second gate 710, that inherently operate in depletion mode (without any fluorine ions 726 incorporated in the AlGaN layer) and that is operative to shield the first gate 704 from voltage stress. The depletion mode FET also has an output drain 714.

Figure 7B:
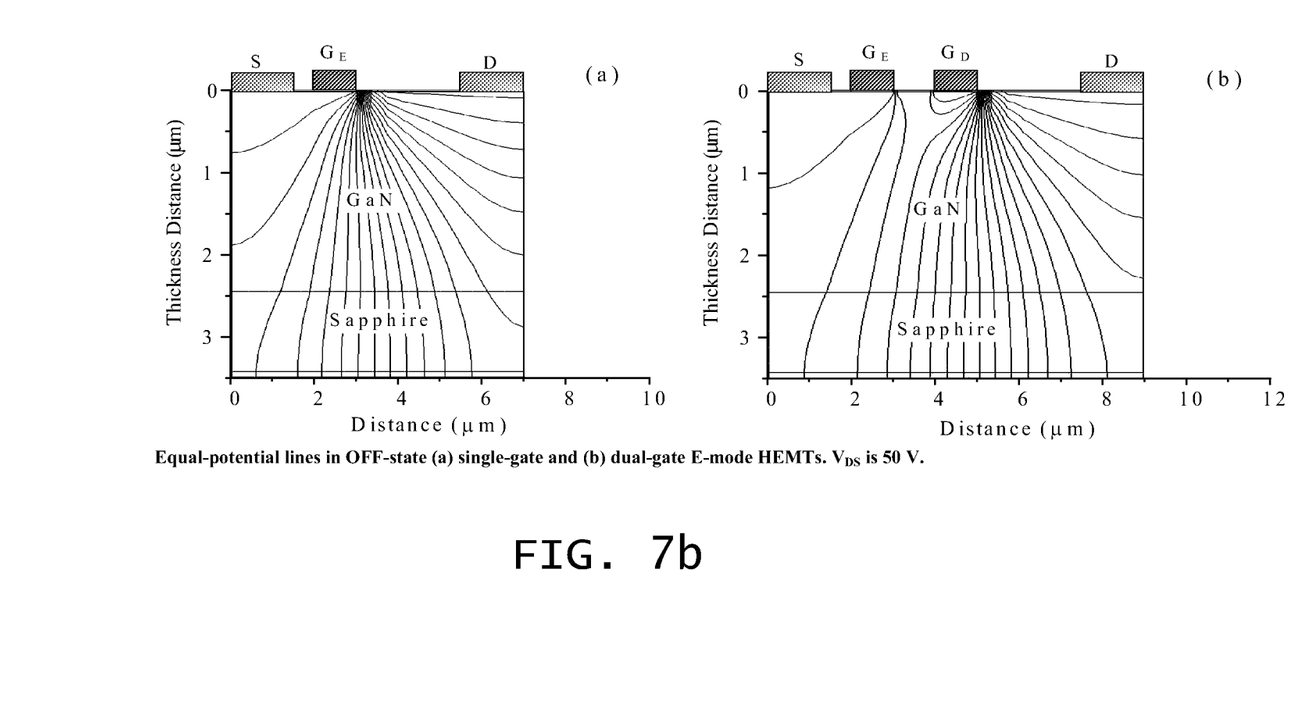
FIG. 7b illustrates the equi-potential profiles in a single- and dual-gate enhancement-mode devices.

The fluorine ions 726, or such other insertion element as may be desired, are shielded from high electrical-field stresses that may be encountered near the depletion mode portion or near the output drain 714. As a result, the fluorine ions 726 are not dislodged or moved by such stresses, and remain in place, preserving the enhancement mode of the common source FET. Since the threshold potential (i.e., the threshold voltage) of the MOSFET 700 is primarily governed by the ability of the common source FET to remain in enhancement mode, the MOSFET 700 has a substantially stable threshold potential in a presence of electrical-field stress at the depletion mode portion. FIG. 7b illustrates the equi-potential profiles in single- and dual-gate enhancement-mode devices. The peak electric-field is located at the edge of the D-mode gate (away from the E-mode gate and fluorine ions) in the dual-gate device.

The output of the cascode arrangement is effectively isolated from the input, both electrically and physically, and thus is very stable. The enhancement mode transistor has nearly constant voltage at both drain and source. The depletion mode transistor has nearly constant voltage at its gate and source. Thus, the only nodes with significant voltage on them are the input and output, and these are separated by the central connection of nearly constant voltage and by the physical distance of two transistors. Thus in practice there is little feedback from the output to the input. Metal shielding is both effective and easy to provide between the two transistors for even greater isolation when required.

The E/D cascode-connected DG HEMT structure has improved stability of Vth of E-mode HEMTs under high-electric-field stress. The D-mode gate resides between the E-mode gate and the drain, and is electrically connected to the source, effectively shielding the E-mode gate (where is treated by fluorine plasma) from high electrical field during high voltage device operation. No persistent negative shift in Vth is observed in the DG HEMT after stress. In addition, the E/D DG HEMT shows higher power gain because of the reduced feedback capacitance and larger output resistance.

Both the OFF-state and ON-state, with high-field stress, result in gradual negative shift of Vth. This shift persists even after 24 hours of no-stress rest, indicating the occurrence of high-electric-field-induced negative shift in the threshold voltage. This also suggests that a solution could be found for improving the Vth's stability by shielding the fluorine plasma treated region from high electric field.

Both the OFF-state and ON-state stress results in degradation in the Ron. This degradation, however, recovers after the no-stress rest and even improves (smaller Ron) eventually. The recovery trend is consistent with what has been reported in conventional D-mode HEMTs, although the negative shift in Vth also contributes by presenting a smaller channel resistance. Both Imax and Gm suffer minor degradation under stress, but recover after the no-stress rest, a result of the reduced Ron.

The negative shift in the threshold voltage after long-term high field stress suggests that the certain changes occurred in the gate region as a result of the stress. The negatively charged fluorine ions experience a strong coulomb force during the electric stress, which could lead to a physical migration of these ions away from the gate edge. The reduction of the negatively charged fluorine ions in the gate region could then lead to a negative shift in Vth. A direct observation of the electrical-stress-induced migration of the fluorine ions is needed to confirm this argument.

Thermal stress test of an E-mode HEMT was conducted by putting the device on a hot stage at 350° C. in vacuum, for up to 153 hours. At various time, the device was taken out and cooled down to room temperature, at which the dc testing was performed. No obvious degradation is observed in Vth, Imax, Gm and Ron.

The HEMT of FIG. 1 is a highly efficient GaAs enhancement/depletion (E/D) dual-gate (DG) high electron mobility ET (HEMT) that can be operated with a small single biasing supply with a large output impedance, about an order of magnitude larger than a single-gate FET). It has a small feedback capacitance, since the second gate screens the signal feedback from the drain to the first gate, improving isolation between input and output terminals and improving linearity of input-output characteristics, as well as improving device gain. It has a small phase distortion, since polarity of phase deviation in common-source FETs and common-gate FETs is opposite. Finally, it has a large design flexibility, since the first gate has high gain and the second gate has high breakdown voltage.

Figure 8:
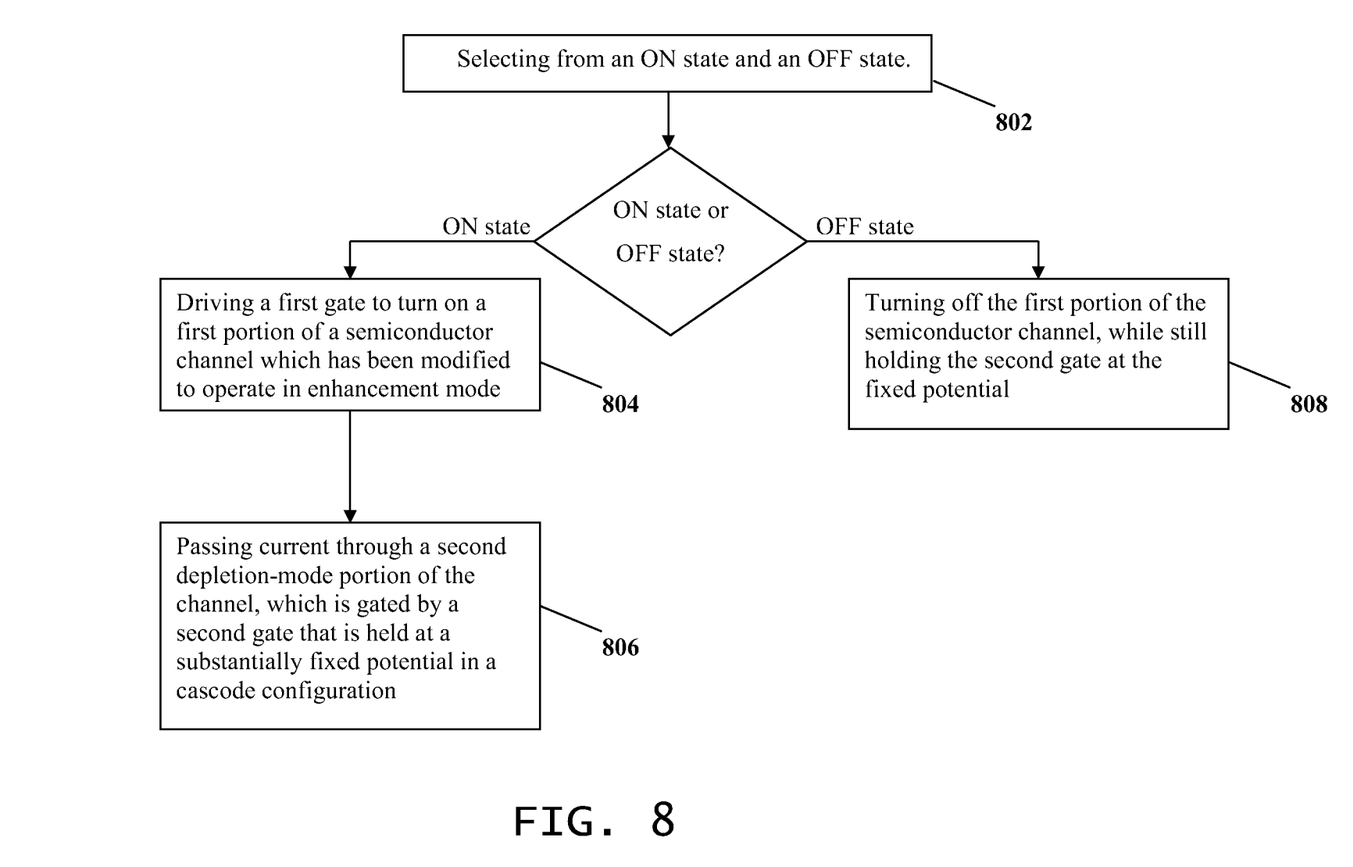
FIG. 8 is a flowchart of a method of operating a field-effect transistor that incorporates at least one teaching of the present invention.

FIG. 8 is a flowchart of a method of operating a field-effect transistor that incorporates at least one teaching of the present invention. The method includes selecting 802 from an ON state and an OFF state. In the ON state, the method includes driving 804 a first gate to turn on a first portion of a semiconductor channel which has been modified to operate in enhancement mode. The method also includes passing 806 current through a second depletion-mode portion of the channel. The current and the channel are gated by a second gate, which is held at a substantially fixed potential in a cascode configuration. In the OFF state, the method includes turning 808 off the first portion of the semiconductor channel, while still holding the second gate at the fixed potential, wherein the second portion of the channel shields the first gate from voltage stress.

Figure 9A:
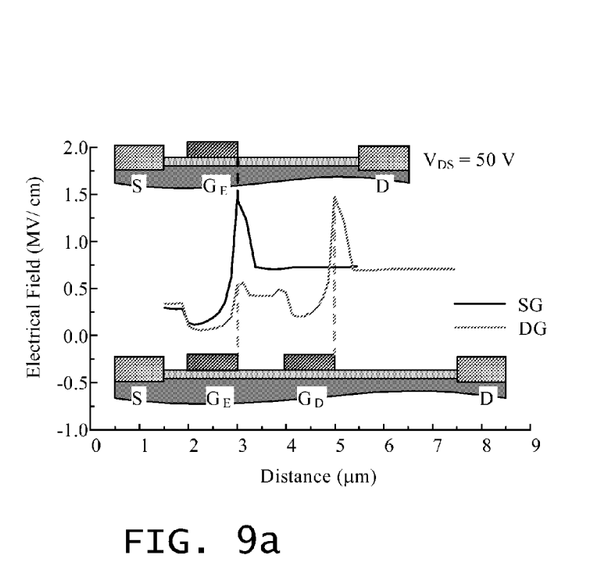
FIG. 9a is a graph of electric-field strength distribution from the source to drain in, in accordance with the E-mode single-gate and E/D dual-gate HEMTs of FIG.

FIG. 9a is a graph of electric-field strength distribution from the source to drain in, in accordance with the E-mode single-gate and E/D dual-gate HEMTs of FIG. 7. The simulation is carried out using ISE's Santaurus simulator. VDS is set at 50 V. In the dual-gate device, the peak field occurs at the drain-side of the D-mode gate instead of the E-mode gate where the fluorine ions are located. As indicated by the simulation results, the electric fields peak at the edge of the D-mode gate of the E/D DG device.

Figure 9B:
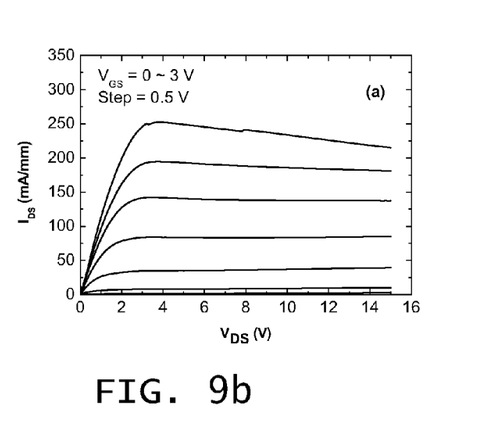
FIG. 9b is a chart that shows E/D dual-gate HEMT characteristics, dc source-drain output characteristics, short-circuit current gain (h21) and maximum stable/maximum available gain (MSG/MAG), for the dual-gate device in comparison with the single-gate device.
Figure 9C:
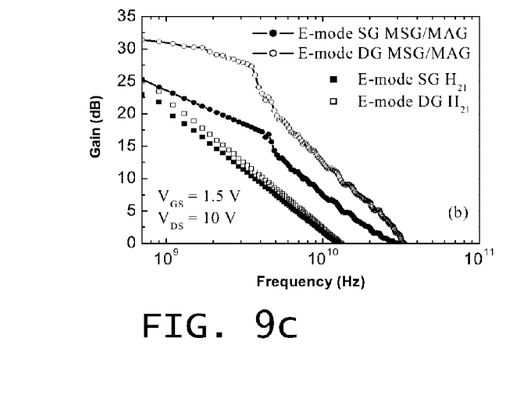
FIG. 9c is a graph that shows a variation of Vth as a function of high-field stress time in single-gate and dual-gate E-mode HEMTs, and FIG. 9d similarly compares gain v. frequency for single and dual-gate devices.

FIG. 9b is a chart that shows E/D dual-gate HEMT, dc source-drain output characteristics. FIG. 9c shows the short-circuit current gain (h21) and maximum stable/maximum available gain (MSG/MAG), for the dual-gate device in comparison with the single-gate device. The dual-gate HEMT shows improved power gain because of the increased output resistance and the reduced feedback capacitance.

The threshold voltage of the E/D DG HEMT exhibits much improved stability with no persistent negative shift. The trend of Vth as a function of the electrical-stress time is very close in the E/D dual-gate HEMT and the D-mode single gate HEMT (which did not experience the fluorine plasma treatment). Compared to the single gate device, the dual-gate HEMT also shows comparable dc performance and improved high frequency power gain as a result of the reduced feedback capacitance and increased output resistance.

Figure 9D:
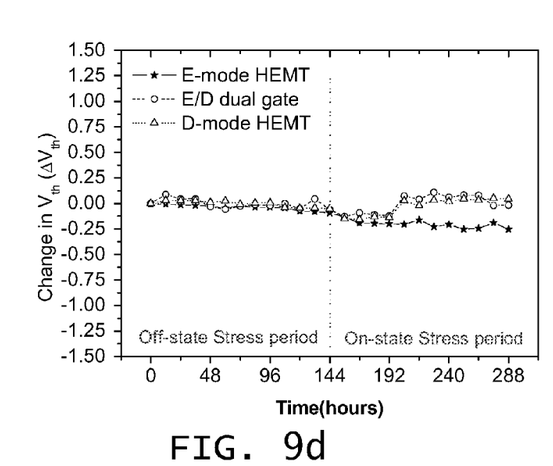

FIG. 9d is a graph that shows a variation of Vth as a function of high-field stress time in single-gate and dual-gate E-mode HEMTs. The results of a D-mode single-gate HEMT are also plotted for comparison. Moderate negative shift in Vth is observed in the fluorine plasma treated enhancement-mode HEMT under high-electric-field stress. The device is stable under thermal stress at 350° C. for 153 hours. An E/D dual-gate HEMT is demonstrated to be effective in preventing the shift in Vth and improving its reliability by shielding the E-mode gate with a D-mode gate from high electric field. Similarly, FIG. 9c compares gain v. frequency for single and dual-gate devices as described.

Several implementations and embodiments have thus been described. It will be appreciated, however, that other implementations and embodiments may also be substituted within the scope of this disclosure. For example, the field-effect transistor need not include a HEMT; another type of transistor may be used.

Thus, although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed; rather, the invention extends to all functionally equivalent structures, methods, and uses such as are within the scope of the appended claims.

It is to be noted, however, that the appended drawings illustrate only typical embodiments of the present claimed subject matter and are, therefore, not to be considered limiting of the scope of the present claimed subject matter, as the present claimed subject matter may admit to other equally effective embodiments.

According to various disclosed classes of embodiments, there is provided: A field-effect transistor, comprising: a first gate; a second gate held at a substantially fixed potential in a cascode configuration; and a semiconductor channel having an enhancement mode portion, gated to be turned on and off by said first gate, which has been modified to operate in enhancement mode, and a depletion mode portion, gated by said second gate, which has been modified to operate in depletion mode, and which is operative to shield the first gate from voltage stress.

According to various disclosed classes of embodiments, there is provided: An active device structure in a III-N-type semiconductor material, comprising: first and second conductive source/drain regions, positioned to connect to different locations of a III-N-type semiconductor channel; and first and second gate terminals, each capacitively coupled to a different respective portion of said channel between said source/drain regions; said channel having different respective threshold voltages, of opposite signs, with respect to said first and second gate terminals.

According to various disclosed classes of embodiments, there is provided: A method of operating a field-effect transistor, comprising: in the ON state, driving a first gate to turn on a first portion of a semiconductor channel which has been modified to operate in enhancement mode, while also passing current through a second depletion-mode portion of said channel which is gated by a second gate which is held at a substantially fixed potential in a cascode configuration; in the OFF state, turning off said first portion of said semiconductor channel, while still holding said second gate at said fixed potential, wherein said second portion of said channel shields said first gate from voltage stress.

According to various disclosed classes of embodiments, there is provided: A method of operating a III-N field-effect transistor, comprising: in the ON state, driving a first gate to turn on a first portion of a III-N semiconductor channel, while also passing current through a second portion of said channel which is gated by a second gate which is held at a substantially fixed voltage; and in the OFF state, turning off said first portion of said semiconductor channel, while still holding said second gate at said fixed potential; wherein said first portion of said channel, but not said second portion of said channel, is coupled to localized fixed charge; whereby the operation of said second gate limits voltage stress on said localized fixed charge.

According to various disclosed classes of embodiments, there is provided: A fluoride based plasma method for converting channel of an as-grown depletion-mode (D-mode) III-nitride HEMT structures into E-mode, the fluoride based plasma method comprising: depleting electrons in a channel without significantly affecting carrier mobility, including incorporating negatively charged fluorine ions into a top AlGaN barrier, implementing a D-mode gate containing no fluorine ions but having a high E-field; implementing a modifiable D-mode gate containing no fluorine ions but having a high E-field; converting the modifiable D-mode gate to an E-mode gate containing fluorine ions; arranging a cascode-connection of the E-mode gate and the D-mode gate; and shielding fluorine ions from a high electric-field even under high drain voltage.

According to various disclosed classes of embodiments, there is provided: A field-effect transistor includes a first gate, a second gate held at a substantially fixed potential in a cascode configuration, and a semiconductor channel. The semiconductor channel has an enhancement mode portion and a depletion mode portion. The enhancement mode portion is gated to be turned on and off by the first gate, and has been modified to operate in enhancement mode. The depletion mode portion is gated by the second gate, and has been modified to operate in depletion mode and that is operative to shield the first gate from voltage stress.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For example, a wide variety of geometries can be used to lay out the first and second gates and the source/drain regions.

For another example, the profiles of the source and drain regions can be different or similar.

Moreover, a wide variety of diffusion or metallization structures can be used to control the distribution of electric field maxima (in the off state) and current density maxima (in the on state) near the source/drain regions.

For example, the materials used do not strictly have to be the AlGaN/GaN combination of the preferred embodiment. As this technology develops, it is to be expected that the disclosed innovative teachings will be applied to other semiconductor alloys which have similar behavior.

For another example, the disclosed teachings are not strictly limited to HEMT-type devices, but can also be used with IGFETs or even IGFET/HEMT hybrids.

The disclosed innovations provide a basic innovation in FET-type current injection structures. As will be appreciated by those skilled in device technology, this injection structure can be used in a wide variety of more complex devices, including devices which are partially bipolar as well as unipolar devices.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A field-effect transistor, comprising:
    a first gate having a first connection to a variable voltage source;
    a second gate having a second connection to a fixed voltage source and held at a substantially fixed potential in a cascode configuration; and
    a semiconductor channel having
        an enhancement mode portion, gated to be turned on and off by said first gate, which has been modified to operate in enhancement mode, and
        a depletion mode portion, gated by said second gate, which has been modified to operate in depletion mode, and which is operative to shield the first gate from voltage stress.

2. The field-effect transistor of claim 1, wherein said enhancement mode portion further has a fixed charge positioned to deplete the semiconductor channel near the first gate.

3. The field-effect transistor of claim 2, wherein:
    the depletion mode portion is situated between the enhancement mode portion and a drain terminal of the field-effect transistor; and
    said fixed charge is at least partially shielded by the depletion mode portion of the semiconductor channel to mitigate fixed charge migration from the enhancement mode portion in response to an electrical-field at the depletion mode portion.

4. The field-effect transistor of claim 1, wherein the field-effect transistor has a substantially stable threshold voltage under electrical-field stress at said depletion mode portion.

5. The field-effect transistor of claim 1, wherein the second connection to the fixed voltage source is electrically coupled to a source terminal of the field effect transistor.

6. An active device structure in a III-N-type semiconductor material, comprising:
    a first conductive source and drain region and a second conductive source and drain region, positioned to connect to different locations of a III-N-type semiconductor channel; and
    first and second gate terminals in a cascode configuration, each capacitively coupled to a different respective portion of said III-N-type semiconductor channel between said first conductive source and drain region and the second conductive source and drain region, and wherein one of said gate terminals has a first connection to a variable voltage source, and the other has a second connection to a fixed voltage source;
    said III-N-type semiconductor channel having different respective threshold voltages, of opposite signs, with respect to said first and second gate terminals.

7. The structure of claim 6, wherein said channel consists essentially of Gallium Nitride.

8. The structure of claim 6, wherein both said gate terminals are separated from said channel by a semiconductor layer having a wider bandgap than said channel.

* * * * *